(12) United States Patent
Hsia et al.

(10) Patent No.: US 8,809,899 B2
(45) Date of Patent: Aug. 19, 2014

(54) LED STRUCTURE

(71) Applicant: TSMC Solid State Lighting Ltd., Hsinchu (TW)

(72) Inventors: Shouli Steve Hsia, Taipei (TW); Chih-Kuang Yu, Chiayi (TW); Ken Wen-Chien Fu, Hsinchu (TW); Hung-Yi Kuo, Taipei (TW); Hung-Chao Kao, Taipei (TW); Ming-Feng Wu, Toufen Township (TW); Fu-Chih Yang, Fengshan (TW)

(73) Assignee: TSMC Solid State Lighting Ltd., HsinChu (TW)

( * ) Notice: Subject to any disclaimer, the term of this patent is extended or adjusted under 35 U.S.C. 154(b) by 0 days.

(21) Appl. No.: 14/082,663

(22) Filed: Nov. 18, 2013

(65) Prior Publication Data

US 2014/0061688 A1  Mar. 6, 2014

Related U.S. Application Data

(63) Continuation of application No. 13/167,878, filed on Jun. 24, 2011, now Pat. No. 8,587,018.

(51) Int. Cl.
   *H01L 33/00* (2010.01)

(52) U.S. Cl.
   USPC ............................ 257/99; 257/79; 438/22

(58) Field of Classification Search
   USPC ............................ 257/99, 79; 438/48
   See application file for complete search history.

(56) References Cited

U.S. PATENT DOCUMENTS

| | | | |
|---|---|---|---|
| 7,122,901 B2 | 10/2006 | Sunohara et al. | |
| 2008/0169548 A1 | 7/2008 | Baek et al. | |
| 2010/0102735 A1 | 4/2010 | Chang et al. | |

OTHER PUBLICATIONS

Kevin Tseng, "Protection Zener Series a New Application in LED Field" Powered by Nature, Jul. 7, 2004, pp. 1-14.

*Primary Examiner* — Julio J Maldonado
*Assistant Examiner* — Robert Bachner
(74) *Attorney, Agent, or Firm* — Haynes and Boone, LLP

(57) ABSTRACT

A light emitting diode (LED) structure comprises a first dopant region, a dielectric layer on top of the first dopant region, a bond pad layer on top of a first portion the dielectric layer, and an LED layer having a first LED region and a second LED region. The bond pad layer is electrically connected to the first dopant region. The first LED region is electrically connected to the bond pad layer.

16 Claims, 16 Drawing Sheets

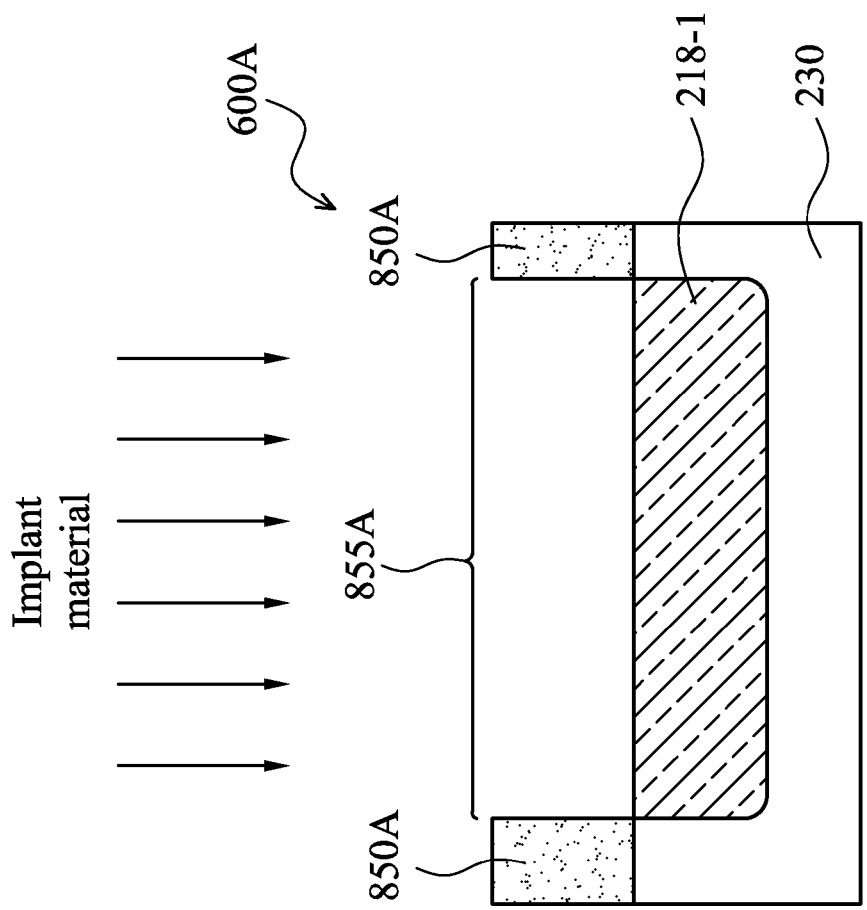

US 8,809,899 B2

LED STRUCTURE

PRIORITY DATA

The present application is a continuation patent application of U.S. patent application Ser. No. 13/167,878, filed on Jun. 24, 2011, entitled "LED STRUCTURE", the disclosure of which is hereby incorporated by reference in its entirety.

FIELD

The present disclosure is related to a light emitting diode (LED) structure.

BACKGROUND

In some approaches, high voltage light emitting diode (LED) solutions include discrete LEDs and Zener diodes mounted on a print circuit board (PCB). The whole circuitry, however, occupies PCB space. Integrating the LEDs and the Zener diodes on the PCB also poses challenges.

In some other approaches, a high voltage multi P-N junction LED die is used. Here, the Zener diodes are mounted with the LED die on a board. The Zener diodes, however, protect the die and/or the package chip, but do not protect the P-N junctions on the die. During fabrication of the LED or assembly of the circuit with the LEDs, the junctions and thus the LED die may be damaged due to an electro static discharge (ESD). Additionally, because the LEDs operate under a high voltage, the junctions may also be damaged due to the high break down voltage.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 6A-6K are cross section views illustrating the steps of manufacturing the LED circuit in FIG. 1, in accordance with some embodiments.

Like reference symbols in the various drawings indicate like elements.

DETAILED DESCRIPTION

Figure 1:
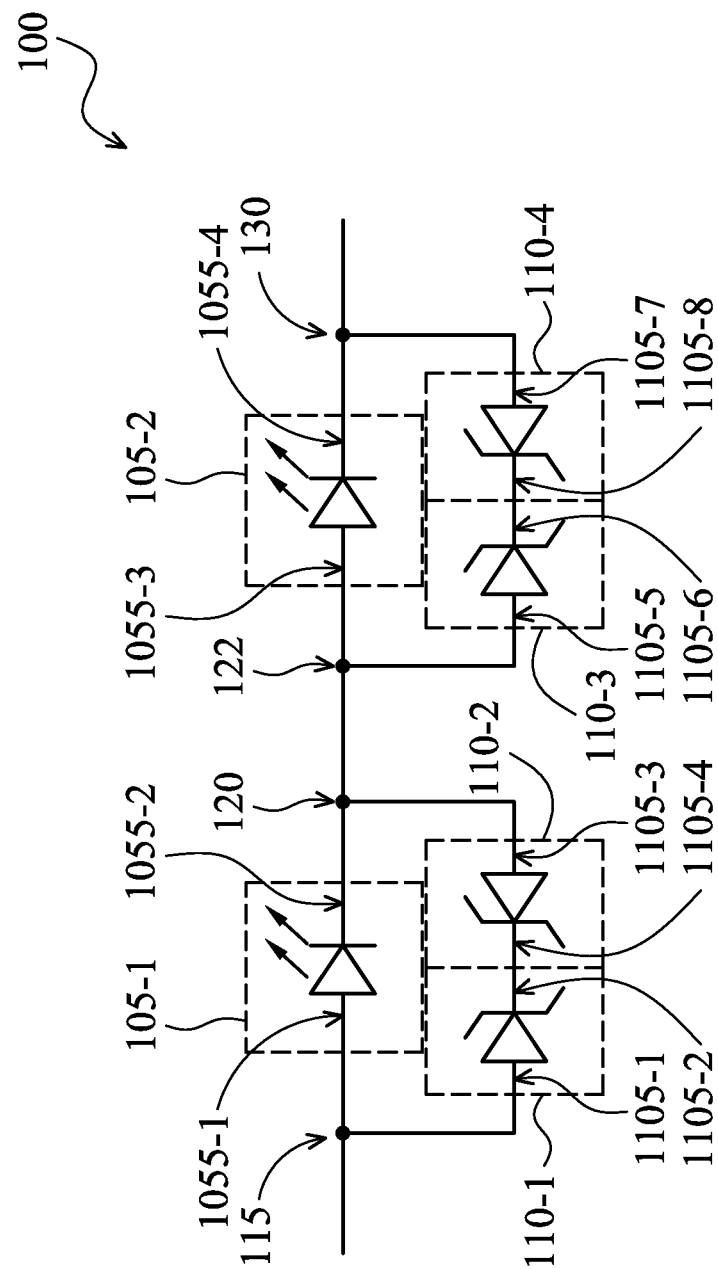
FIG. 1 is a diagram of an LED circuit and FIG. 2 is a cross section view of a semiconductor structure represented by the LED circuit in FIG. 1, in accordance with a first embodiment.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. Various embodiments are used in a high or ultra high voltage multi junction LED die and/or packages. For example, the voltage ranges from 130 V to 260 V. The voltage is a direct current (DC) or an alternating current (AC). The Zener diodes are embedded in the silicon substrate. The embedded Zener diodes prevent breakdown of the silicon substrate and the passivation layer. The Zener diodes also protect the multi-junctions. The LEDs circuit and the protection circuits are manufactured in a same die, are processed at the wafer level, and are integrated in a fabrication process.

Exemplary Circuit

Figure 2:
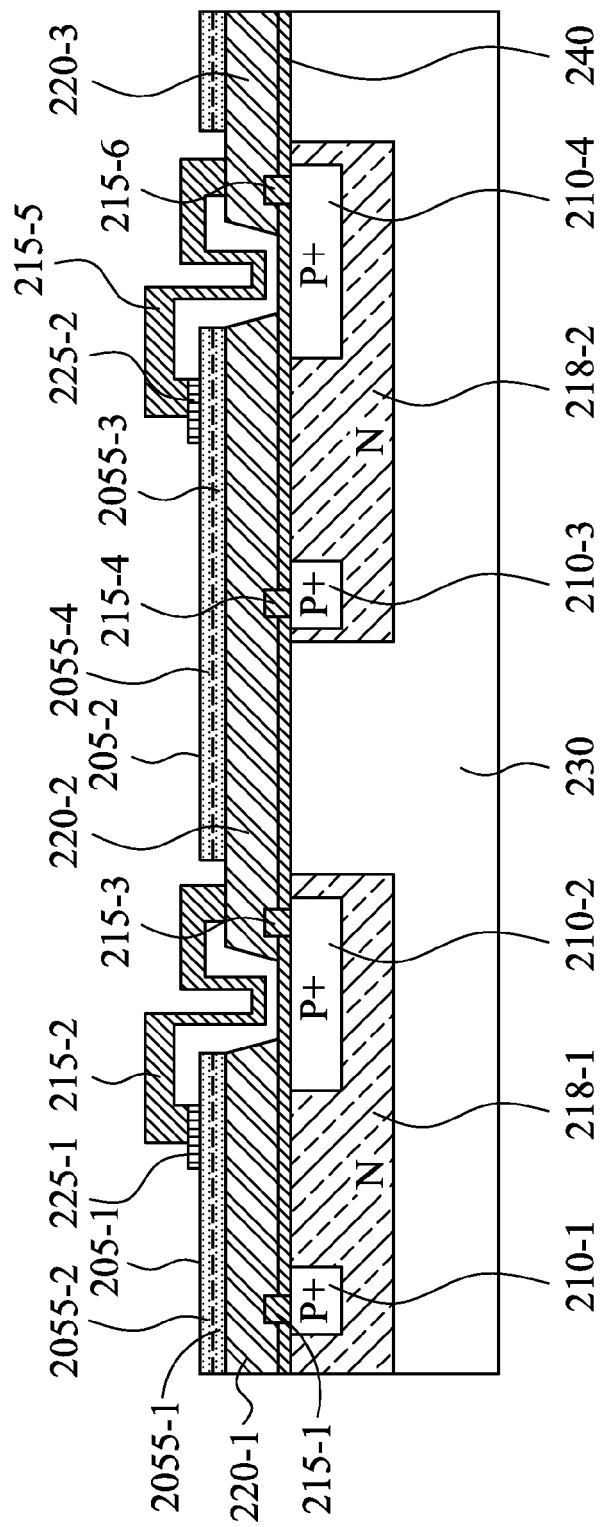

FIG. 1 is a diagram of an LED circuit 100 and FIG. 2 is a cross section diagram of a semiconductor structure represented by the LED circuit 100, in accordance with some embodiments. For simplicity, various elements in the cross section view are not shown in the circuit view. In this document, "P" and "N" refer to the P dopant and N dopant, respectively. Further, an N dopant type refers to an N dopant having a lightly doped concentration (N−), a regularly doped concentration (N), or a heavily doped concentration (N+). Similarly, a P dopant type refers to a P dopant having a lightly doped concentration (P−), a regularly doped concentration (P), or a heavily doped (P+) concentration.

Circuit 100 having two LEDs 105-1 and 105-2 is used for illustration. A chain of LEDs 105 having different numbers of LEDs is within the scope of various embodiments. The operation of the LED chain having more than two LEDs should be recognizable by persons of ordinary skill in the art in view of the illustrative embodiments disclosed in this document. In some embodiments, the LED chain includes 80 LEDs and 80 corresponding protection circuits.

LED 105-1 includes a P side 1055-1 and an N side 1055-2. LED 105-1 corresponds to LED layer 205-1 in FIG. 2, and is lit when a voltage applied across LED 105-1 is higher than the threshold voltage of LED 105-1. At that time, a current flows through LED 105-1. In some embodiments, the threshold voltage of LED 105-1 is about 3.2 V. The P side 1055-1 of LED 105-1 corresponds to the bottom portion 2055-1 of LED layer 205-1. The N side 1055-2 of LED 105-1 corresponds to the top portion 2055-2 of LED layer-1 205-1. In some embodiments, LED 105-1 is epitaxially grown with corresponding dopants. For example, the P portion is epitaxially grown with a P dopant, and the N portion is epitaxially grown with an N dopant.

In some embodiments, an LED 105 is coupled to a pair of Zener diodes 110. For example, LED 105-1 is coupled to a pair of Zener diodes 110-1 and 110-2. The P side 1105-1 of Zener diode 110-1 is coupled to the P side 1055-1 of LED 105-1. The P side 1105-3 of Zener diode 110-2 is coupled to the N side 1055-2 of LED 105-1. The N sides 1105-2 and 1105-4 of Zener diodes 110-1 and 110-2 are coupled together. Zener diode 110-1 is formed by P+ region 210-1 (i.e., a heavily P-doped region) and N region 218-1 illustratively shown in FIG. 2. P side 1105-1 of Zener diode 110-1 corresponds to P+ region 210-1. N side 1105-2 of Zener diode 110-1 corresponds to N region 218-1. Zener diode 110-2 is formed by P+ region 210-2 and N region 218-1. P side 1105-3 of Zener diode 110-2 corresponds to P+ region 210-2. N side 1105-4 of Zener diode 110-2 corresponds to N region 218-1. Zener diodes 110-1 and 110-2 are formed in a P-type silicon substrate 230. A silicon substrate is commonly called a silicon carrier or a silicon submount. Zener diodes 110 are called embedded Zeners because they are embedded in substrate 230. Zener diodes 110 serve as protection circuits for LEDs 105.

Connecting metal 215-1 in the form of a via connects P+ region 210-1 and bond pad 220-1. In some embodiments, bond pad 220-1 includes metal. Bond pad 220-1 is in contact and electrically coupled with portion 2055-1 of LED layer 205-1. As a result, portion 2055-1 is electrically coupled with P+ region 210-1. This coupling corresponds to the circuit representation in FIG. 1 that P side 1055-1 of LED 105-1 is coupled to P side 1105-1 of Zener diode 110-1 through node 115.

Connecting metal 225-1 couples portion 2055-2 of LED layer 205-1 and connecting metal 215-2. Bond pad 220-2 couples connecting metal 215-2 and via 215-3. Because via 215-3 is coupled to P+ region 210-2, P+ region 210-2 is electrically coupled to N region 2055-2 of LED layer 205-1. This coupling corresponds to the circuit representation that P side 1105-3 of Zener diode 110-2 is coupled to N side 1055-2 of Zener diode 105-1 through node 120.

Similar to LED 105-1, LED 105-2 includes a P side 1055-3 and an N side 1055-4. LED 105-2 corresponds to LED layer 205-2 in FIG. 2, and is lit when a voltage applied across LED 105-2 is higher than the threshold voltage of LED 105-1. At that time, a current flows through LED 105-2. In some embodiments, the threshold voltage of LED 105-2 is about 3.2V. The P side 1055-3 of LED 105-2 corresponds to the bottom portion 2055-3 of LED layer 205-2. The N side 1055-4 of LED 105-2 corresponds to the top portion 2055-4 of LED layer 205-2.

Similar to LED 105-1 being coupled to a pair of Zener diodes 110-1 and 110-2, LED 105-2 is coupled to a pair of Zener diodes 110-3 and 110-4. The P side 1105-5 of Zener diode 110-3 is coupled to the P side 1055-3 of LED 105-2. The P side 1105-7 of Zener diode 110-4 is coupled to the N side 1055-4 of LED 105-2 via node 130. The N sides 1105-6 and 1105-8 of respective Zener diodes 110-3 and 110-4 are coupled together. Zener diode 110-3 is formed by P+ region 210-3 and N region 218-2. P side 1105-5 of Zener diode 110-3 corresponds to P+ region 210-3. N side 1105-6 of Zener diode 110-3 corresponds to N region 218-2. Zener diode 110-4 is formed by P+ region 210-4 and N region 218-2. P side 1105-7 of Zener diode 110-4 corresponds to P+ region 210-4. N side 1105-8 of Zener diode 110-4 corresponds to N region 218-2. Similar to Zener diodes 110-1 and 110-2, Zener diodes 110-3 and 110-4 are formed in the P-type silicon substrate 230.

Via 215-4 connects P+ region 210-3 and bond pad 220-2. Bond pad 220-2 is in contact and electrically coupled with portion 2055-3 of LED layer 205-2. As a result, portion 2055-3 of LED layer 205-2 is electrically coupled with P+ region 210-3. This coupling corresponds to the circuit representation in FIG. 1 that P side 1055-3 of LED 105-2 is coupled to P side 1105-5 of Zener diode 110-3 through node 122.

Connecting metal 225-2 couples portion 2055-4 of LED layer 205-2 and connecting metal 215-5. Bond pad 220-3 couples connecting metal 215-5 and via 215-6, which is coupled to P+ region 210-4. As a result, P+ region 210-4 is electrically coupled to N portion 2055-4 of LED layer 205-2. This coupling corresponds to the circuit representation that P side 1105-7 of Zener diode 110-4 is coupled to N side 1055-4 of Zener diode 105-2 through node 130.

Node 120 is electrically the same as node 122, both of which couple N side 1055-2 of LED 105-1, P side 1055-3 of LED 105-2, P side 1105-3 of Zener diode 110-2, and P side 1055-5 of Zener diode 110-3 together. This coupling corresponds to the fact that N portion 2055-2 of LED layer 205-1, connecting metal 215-2, bond pad 220-2, connecting metal 215-3, P+ region 210-2, P portion 2055-3 of LED layer 205-2, via 215-4, and P+ region 210-3 are electrically coupled together.

Passivation layer 240 is a non conducting layer, used to electrically separate conducting layers. For example, layer 240 electrically separates N region 218-1, P+ region 210-1, P+ region 210-2, N region 218-2, P+ region 210-3, and P+ region 210-4 from bond pads 220-1, 220-2, and 220-3. Layer 240 also electrically separates LED layer 205-1 from connecting metal 215-2, etc. In some embodiments, passivation layer includes silicon oxide. Further, various embodiments are advantageous over other approaches because Zener diodes 110 prevent the breakdown of its silicon-carrier and passivation layer 240.

In some embodiments, when an LED 105 in an LED chain does not function, the rest of the LEDs in the chain continue to function, i.e., continues to produce light. Various embodiments are therefore advantageous over other approaches in which when an LED in an LED chain does not function, the rest of the LEDs in the chain are not lit.

Exemplary Operation of Circuit 100

Figure 3:
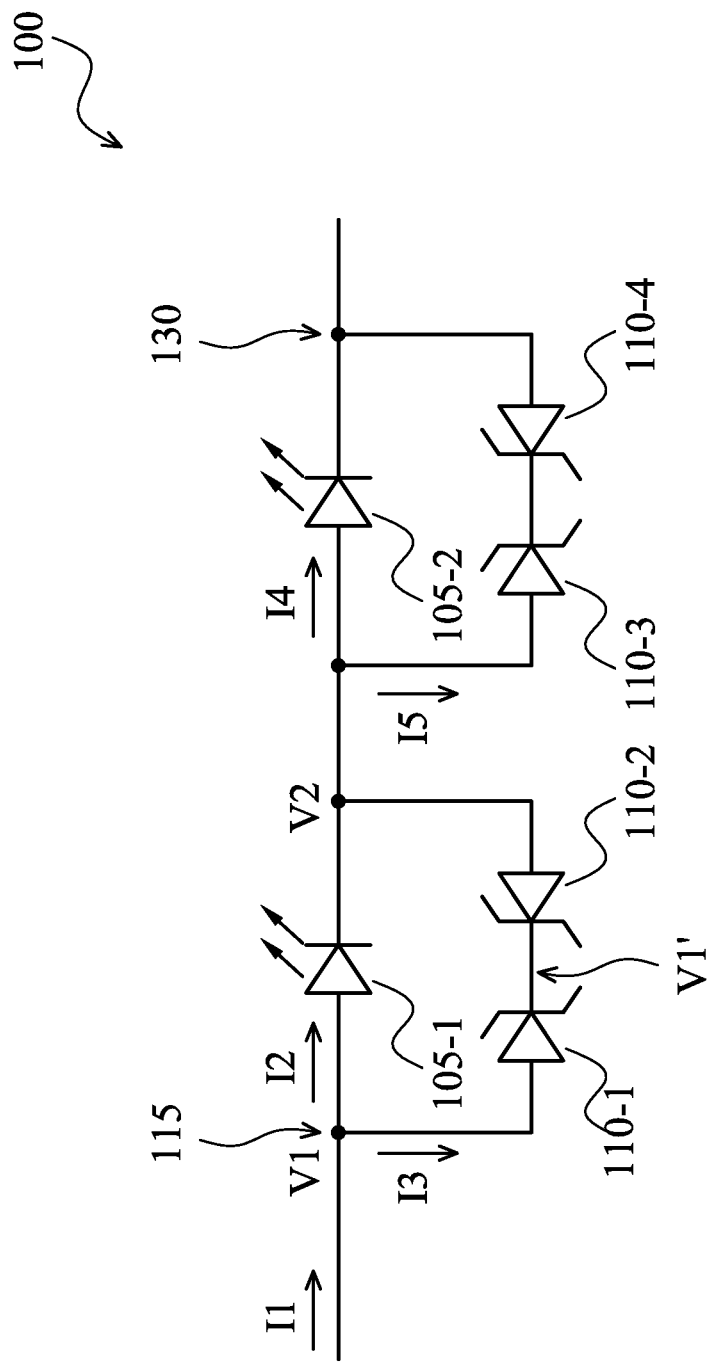
FIG. 3 is a diagram of the LED circuit in FIG. 1 with various details not labeled, in accordance with some embodiments.

FIG. 3 is the same circuit diagram of the LED circuit 100, but without various details of LEDs 105-1, 105-2, and Zener diodes 110-1, 110-2, 110-3, and 110-4. For illustration, voltage V1 is sufficient to light all LEDs 105 in the chain of LEDs 105. For example, if an LED 105 takes 3.0 V to operate, voltage V1 of 300 V is used to light a chain of 100 LEDs 105.

For illustration of one operational state, the conditions present when LEDs 105-1 and 105-2 function normally will be described. In some embodiments, the threshold voltage of an LED 105 is about 3.0V, while the threshold voltage of a Zener diode 110 is about 7.0 V. When LED 105-1 is lit, the voltage applied across LED 105-1 is about 3.0V, and is not sufficient to turn on diode 110-2. As a result, diode 110-2 is off and operates as an open circuit. The current path for current I3 is therefore open. Current I1 flows as current I2. Similarly, the voltage dropped across LED 105-2 is not sufficient to turn on diode 110-4. As a result, diode 110-4 is off and operates as an open circuit. The current path for current I5 is therefore open and current I2 flows as current I4. Effectively, current I1 flows through both LEDs 105-1 and 105-2 as respective currents I2 and I4. Consequently, both LEDs 105-1 and 105-2 are lit.

For illustration of a different operational state, the conditions present when LED 105-1 does not function while LED 105-2 functions normally will be described. If LED 105-1 does not function, but operates as a short circuit, current I1 flows as current I2 and current I4 through LED 105-2. LED 105-2 continues to operate. Effectively, the rest of the LEDs 105 in the LED chain continue to be lit.

If LED 105-1 does not function, but operates as an open circuit, current I1 flows as current I3. Both Zener diodes 110-1 and 110-2 are forward biased because voltage V1 sufficient to light the chain of LEDs 105 is sufficient to forward bias LED 110-1. Voltage V1' is also larger than the breakdown voltage, or the Zener voltage, of Zener diode 110-2. As a result, Zener diode 110-2 operates to allow current I3 to flow through Zener diode 110-2. In other words, current I3 flows through both diodes 110-1 and 110-2. Current I3 then continues to flow as current I4 to light LED 105-2 and the rest of the LEDs in the chain of LEDs 105 (not shown).

Exemplary Circuit—Further Embodiments

Figure 4:
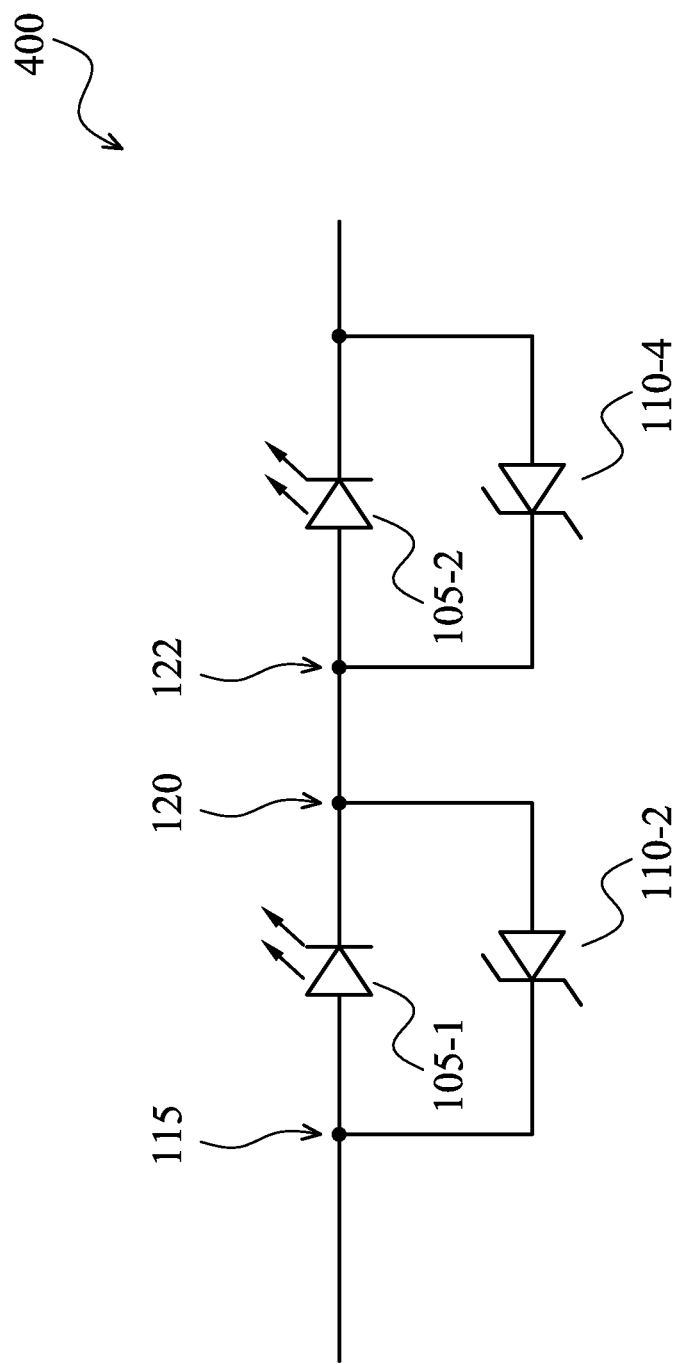
FIG. 4 is a diagram of an LED circuit and FIG. 5 is a cross section view of a semiconductor structure represented by the LED circuit in FIG. 4, in accordance with another embodiment.
Figure 5:
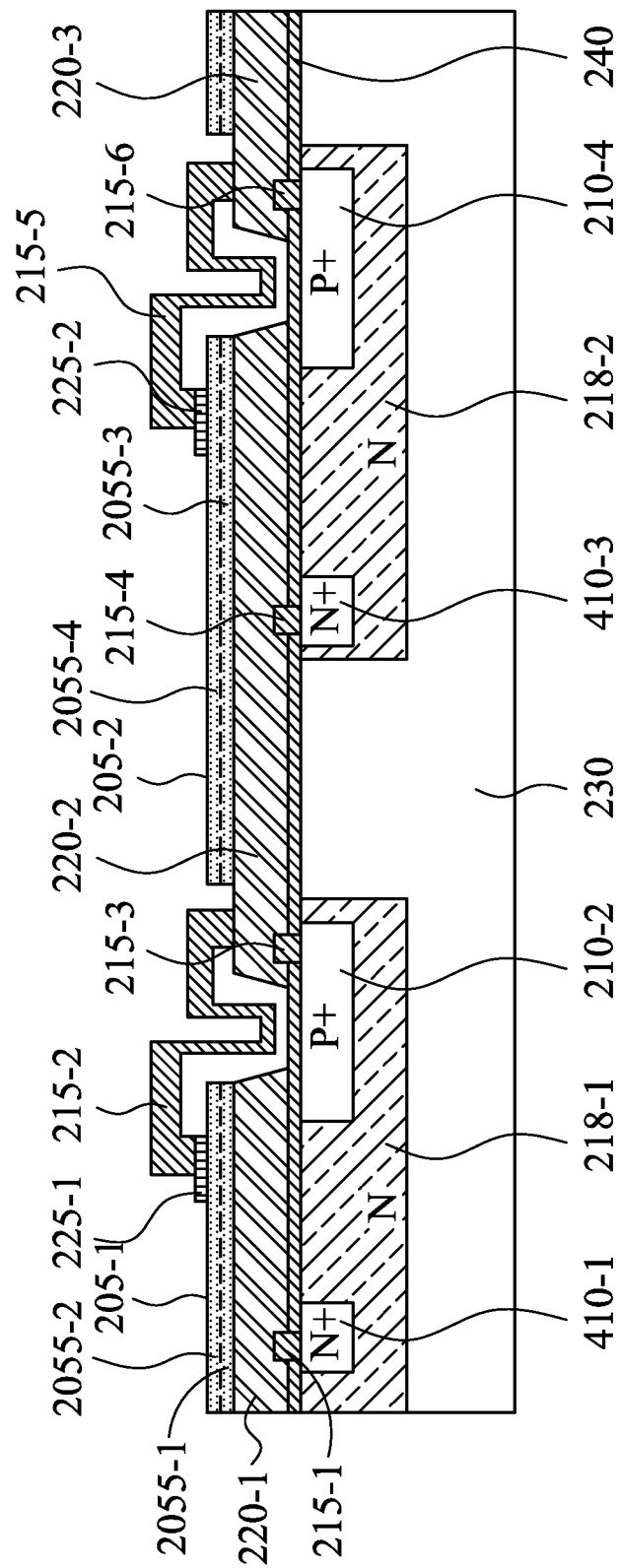

FIG. 4 is a diagram of an LED circuit 400 and FIG. 5 is a cross section diagram of a semiconductor structure represented by the LED circuit 400, in accordance with some embodiments.

Compared with circuit 100, circuit 400 does not include Zener diodes 110-1 and 110-3. In other words, each LED 105 is coupled to one Zener diode 110. For illustration, LED 105-1 is coupled to Zener diode 110-2 while LED 105-2 is coupled to Zener diode 110-4. Consequently, in some embodiments, N+ regions 410-1 and 410-3 replace P+ regions 210-1 and 210-3 in FIG. 1, respectively. Zener diode 110-2 is formed by P+ region 210-2, N region 218-1, and N+ region 410-1. Similarly, Zener diode 110-4 is formed by P+ region 210-4, N region 218-2, and N+ region 410-3.

The N side of Zener diode 110-2 is coupled to the P side of LED 105-1 through node 115. Correspondingly, N region 218-1, N+ region 410-1, connecting metal 215-1, bond pad 220-1, and P portion 2055-1 of LED layer 205-1 are electrically coupled together. Similarly, the N side of Zener diode 110-4 is coupled to node 122, the P side of LED 105-2, node 120, and the N side of LED 105-1. Correspondingly, N region 218-1, N+ region 410-3, connecting metal 215-4, bond pad 220-2, P portion 2055-3 of LED layer 205-2, connecting metal 215-3, P+ region 210-2, connecting metal 215-2, connecting metal 225-1 and N portion of LED layer 205-1 are coupled together.

Functionally, circuit 400 operates in the same manner like circuit 100 in which Zener diodes 110-1 and 110-3 in circuit 100 are in the forward-bias mode. In such a situation, Zener diodes 110-1 and 110-3 operate as short circuits.

In various embodiments, the chain of LEDs 105 is formed in an array configuration. The last LED on a row is coupled to the first LED on the next row. For illustration, a chain of LEDs includes 9 LEDs 105-1 to 105-9. The array has 3 rows and 3 columns. The first row includes LEDs 105-1, 105-2, and 105-3. The second row includes LEDs 105-4, 105-5, and 105-6, and the third row includes LEDs 105-7, 105-8, and 105-9. LED 105-3 on the first row is coupled to LED 105-4 on the second row. LED 105-6 on the second row is coupled to LED 105-7 on the third row. The chain of Zener diodes is configured accordingly to reflect either one of the embodiments of FIG. 1 or FIG. 4. The different numbers of LEDs in the chain, in a row, and/or in a column are within the scope of various embodiments. Zener diodes 110 also protect the P-N junctions in the array structure.

Exemplary Fabrication Steps

FIGS. 6A to 6K are cross section views of structures 600A to 600K used to illustrate the fabrication steps of circuit 100, in accordance with some embodiments.

In FIG. 6A, initially a photo resist layer 850A with an opening 855A is deposited on top of substrate 230. Implantation is then performed through opening 855A on substrate 230. N well 218-1 is thus formed, resulting in structure 600A. After the N-well implantation step, photo resist layer 850A is removed.

Figure 6B:
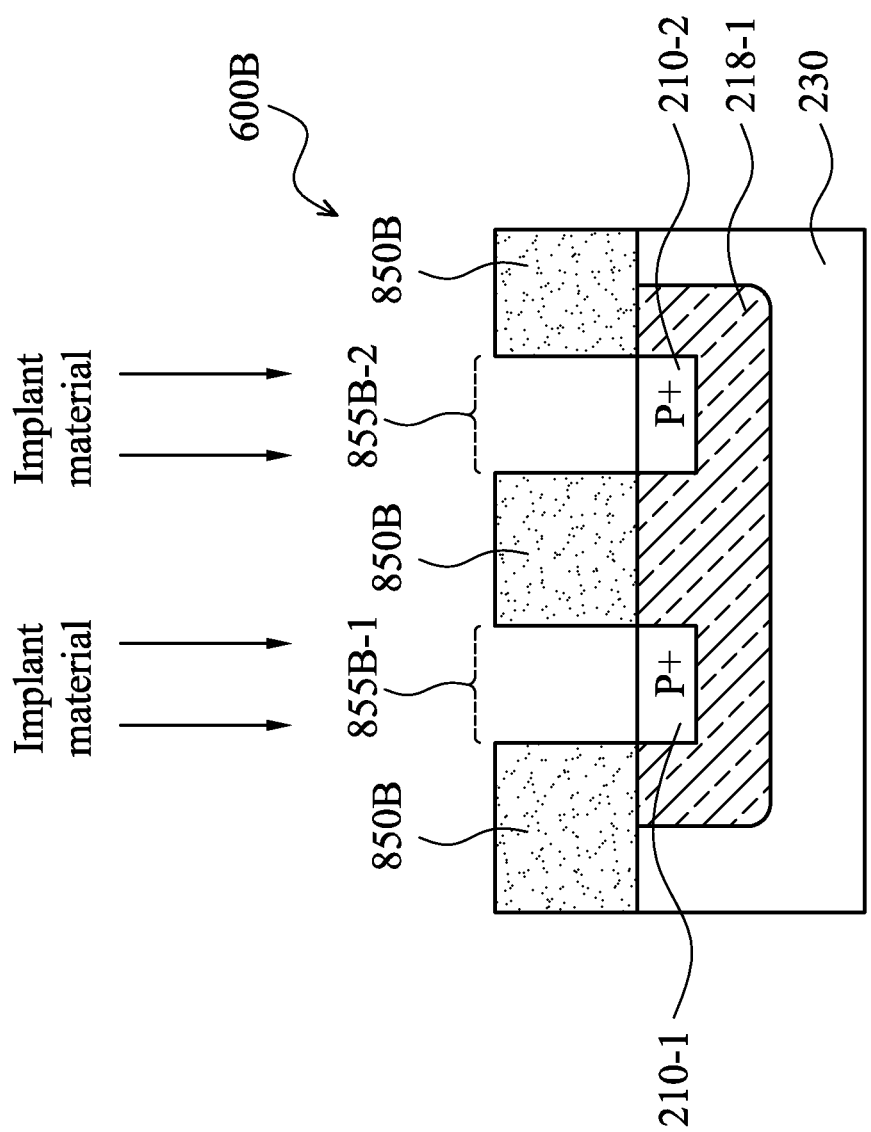

In FIG. 6B, a photo resist layer 850B is deposited on top of structure 600A with photo resist layer 850A having been removed. Photo resist layer 850B includes openings 855B-1 and 855B-2. Implantation is then performed on N-well 218-1 through openings 855B-1 and 855B-2 to form P+ regions 210-1 and 210-2, respectively. As a result, structure 600B is formed. In the case N+ region 410-1 replaces P+ region 210-1, P+ region 210-2 is formed first in some embodiments, then the N+ material is implanted to form N+ region 410-1. In various embodiments, after P+ region 210-2 is formed, a photo resist layer is deposited to cover P+ region 201-2 while the N+ material is implanted. After structure 600B is formed, photo resist layer 850B is removed.

Figure 6C:
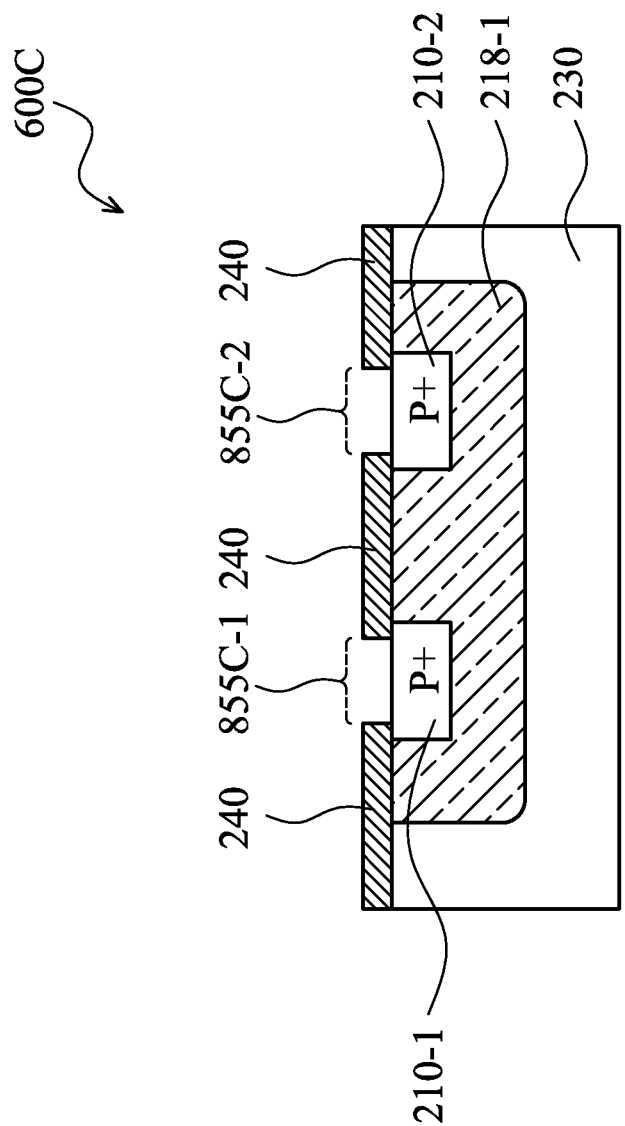

In FIG. 6C, dielectric layer 240 is deposited on top of structured 600B with photo resist layer 850B having been removed. In some embodiments, layer 240 is about 5000Å. Etching is performed through layer 240 to form openings 855C-1 and 855C-2 that expose P+ regions 210-1 and 210-2, respectively. Structure 600C is formed.

Figure 6D:
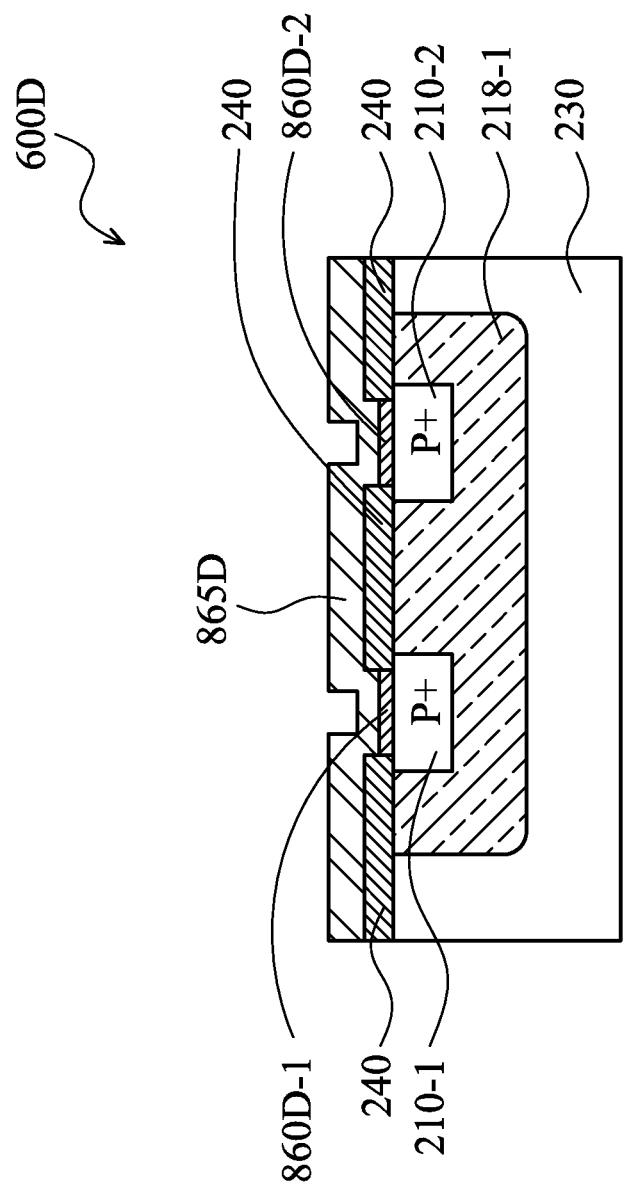

In FIG. 6D, layers 860D-1 and 860D-2 are formed on top of P+ regions 210-1 and 210-2, respectively. Seed layer 865D is then deposited, resulting in structure 600D. In some embodiments, layers 860D-1 and 860D-2 include titanium silicon (Ti—Si) and are used to form the contacts. For example, layer 860D-1 serves as means to electrically couple P+ region 210-1 to bond pad 220-1. Similarly, layer 860D-2 serves as means to electrically couple P+ region 210-2 to bond pad 220-2. Effectively, layers 860D-1 and 860D-2 correspond to connecting metals 215-1 and 215-3 in FIG. 2, respectively. Layer 865D includes titanium copper (Ti—Cu), and serves as a seed layer for layer 862E shown in FIG. 6E.

Figure 6E:
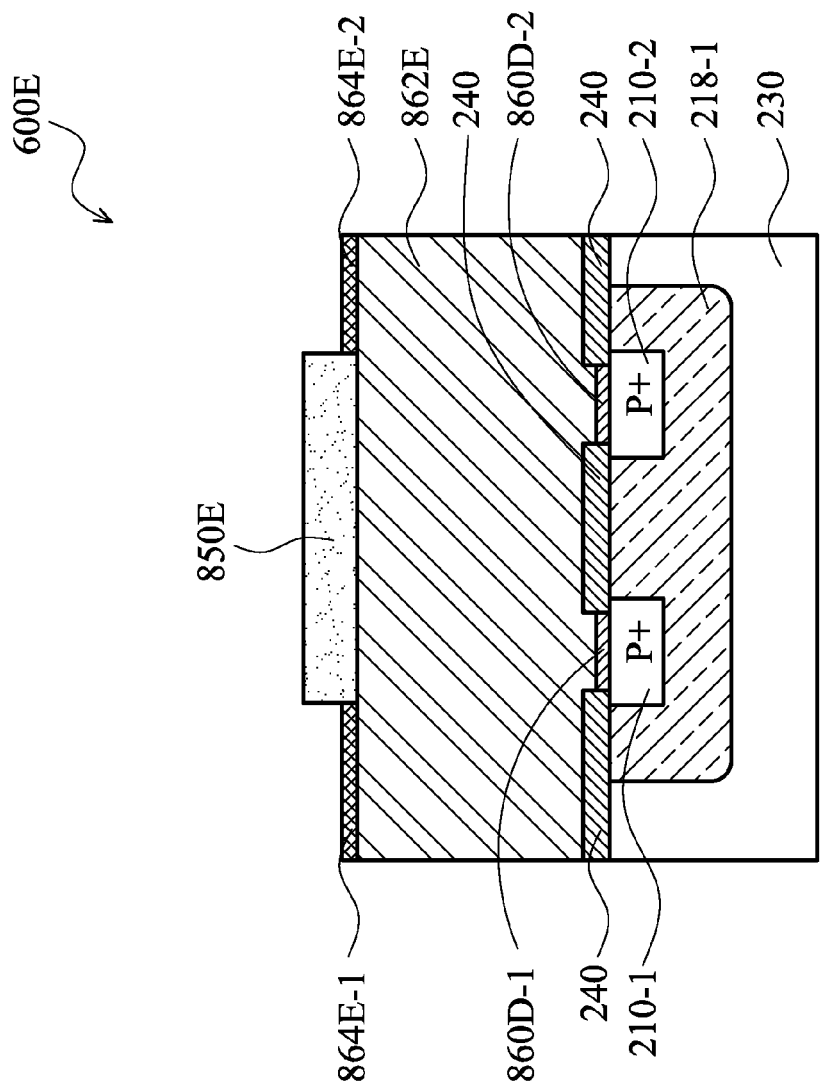

In FIG. 6E, layer 862E is formed on top of structure 600D. Photo resist layer 850E, then layers 864E-1 and 864E-2 are formed on top of layer 862E. Structure 600E is therefore formed. In some embodiments, layer 862E is electroplated with copper (Cu) on top of layer 865D. Effectively, layer 865D is merged into layer 862E. Layer 862E is later separated to form bond pads 220-1 and 220-2. Layer 850E defines the boundary for layers 864E-1 and 864E-2. Layer 864E-1 serves to bond LED layer 205-1 to bond pad 220-1 via portion 2055-1. Similarly, layer 864E-2 serves to bond LED layer 205-2 to bond pad 220-2 via portion 2055-3. Layers 864E-1 and 864E-2 are not shown in FIG. 2. In some embodiments, layers 864E-1 and 864E-2 are electroplated with nickel gold (Ni—Au), silver (Ag), or gold (Au). Other bonding and electrical connection materials and bonding techniques, however, are within the scope of various embodiments. Some exemplary bonding techniques include eutectic bonding, adhesive bonding, fusion/direct bonding, etc. After layers 864E-1 and 864E-2 are formed, photo resist layer 850E is removed.

Figure 6F:
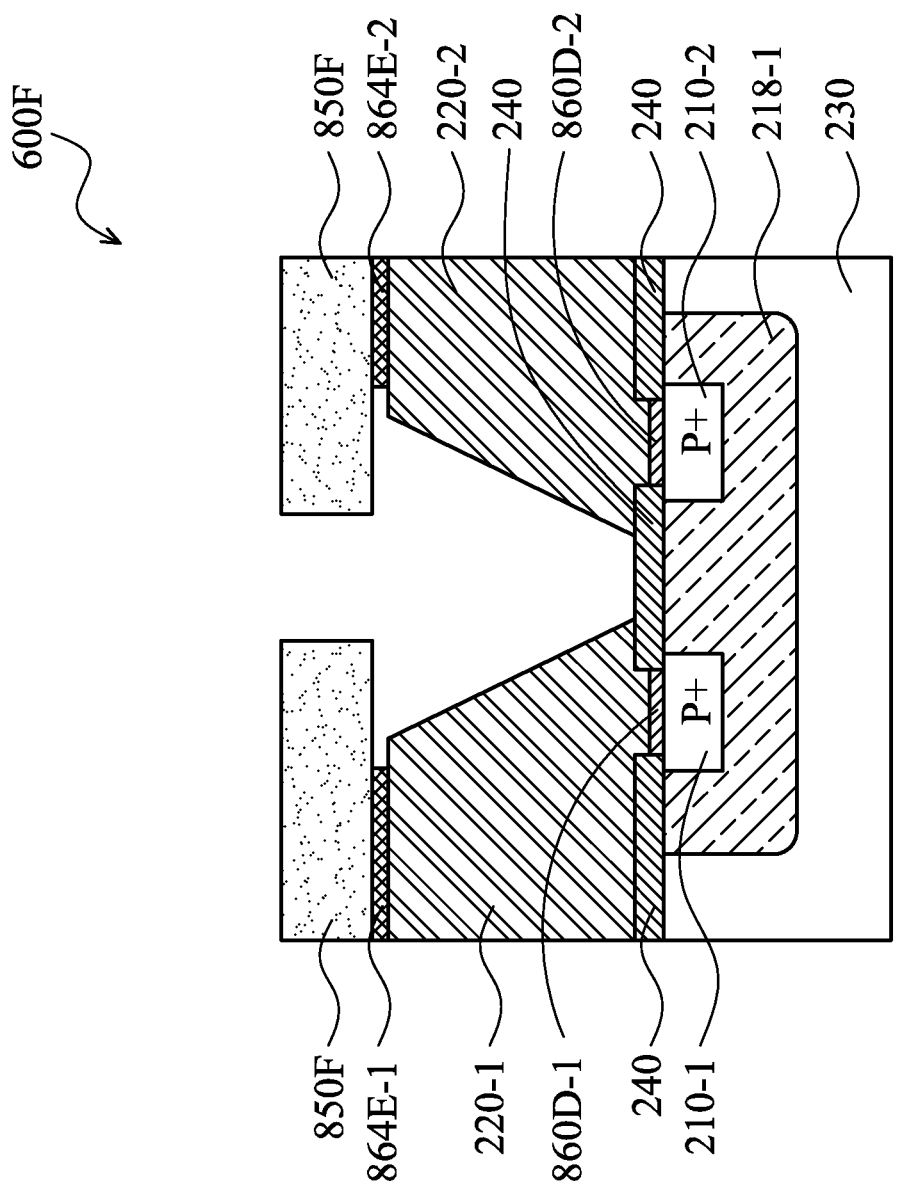

In FIG. 6F, layer 862E is separated to form bond pads 220-1 and 220-2. First, photo resist layer 850F having an opening is formed on top of structure 600E with photo resist layer 850E having been removed. A wet etch process is performed to separate layer 862E into two separate sections corresponding to bond pads 220-1 and 220-2. After the bond pads 220-1 and 220-2 are formed, photo resist layer 850F is removed.

Figure 6G:
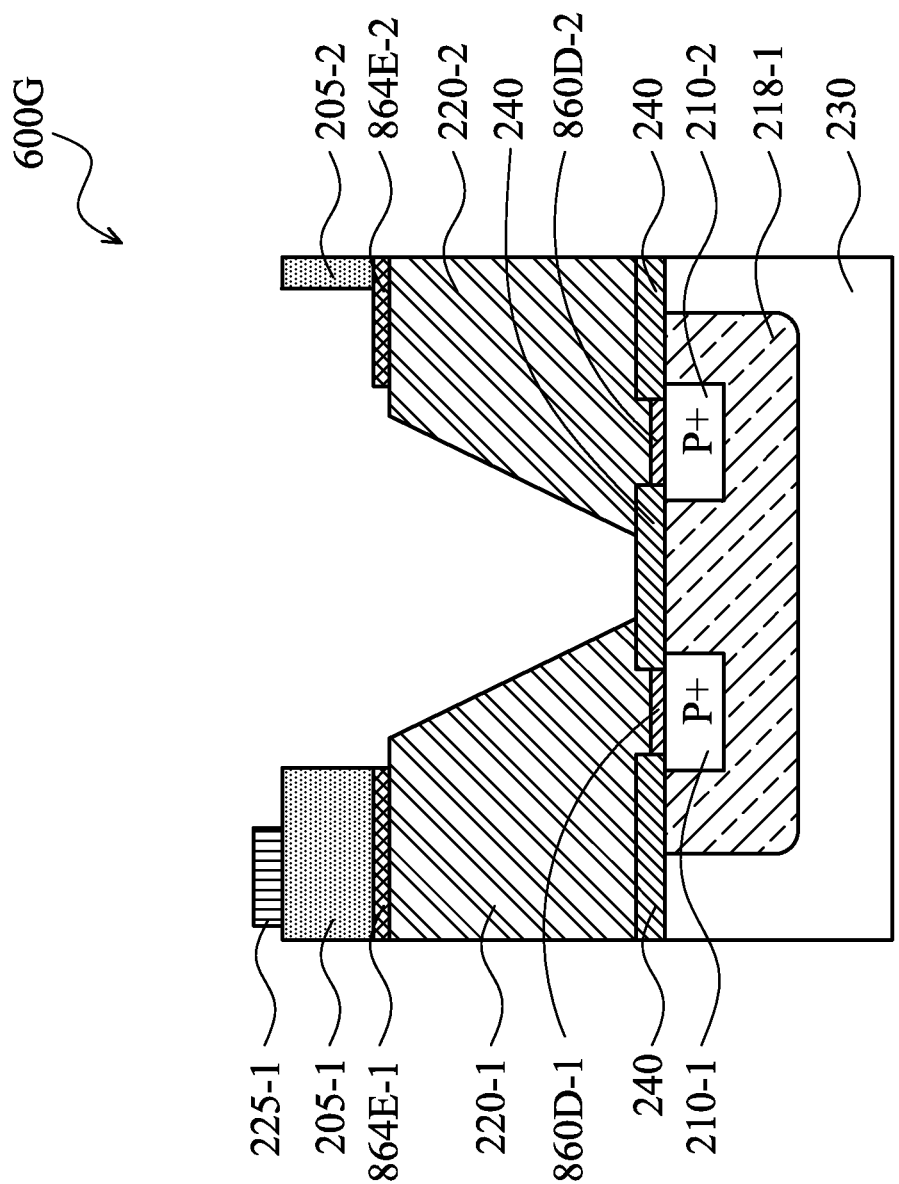

In FIG. 6G, LED layers 205-1 and 205-2 are built on respective layers 864E-1 and 864-E2. Connecting metal 225-1 is formed on top of LED layer 205-1. As a result, structure 600G is formed. In various embodiments, LED layers 205-1 and 205-2 are bonded to respective layers 864E-1 and 864E-2 with high precision alignment. For example, in some embodiments, the bonding shift provided by the bonding tool is within 5 μm to prevent the impact of the downstream lithography process that could degrade device performance and reliabilities caused by leakage.

Figure 6H:
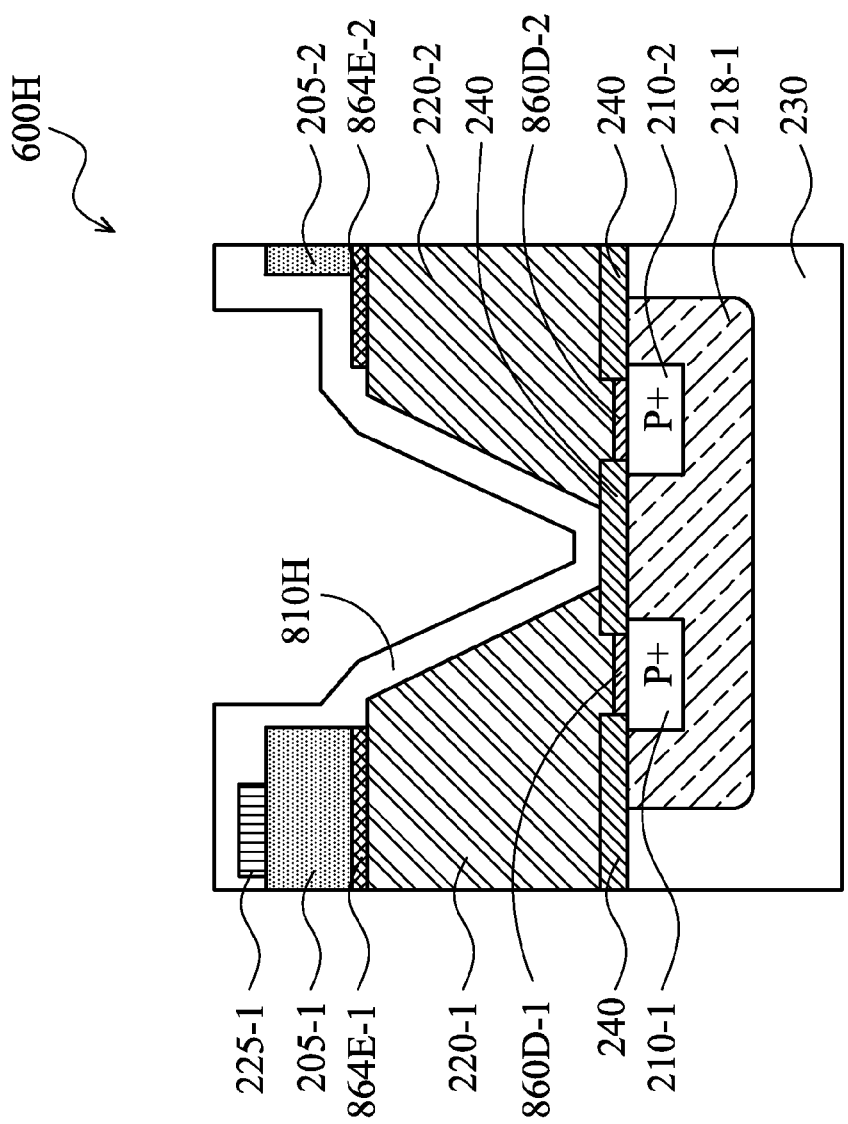

In FIG. 6H, dielectric layer 810H is formed on top of structure 600G, resulting in structure 600H. In some embodiments, dielectric layer 810H is of the same material as dielectric layer 240. Consequently, layer 810H and 240 are considered as one dielectric layer. Dielectric layer 810H and 240 being of different materials are within the scope of various embodiments.

Figure 6I:
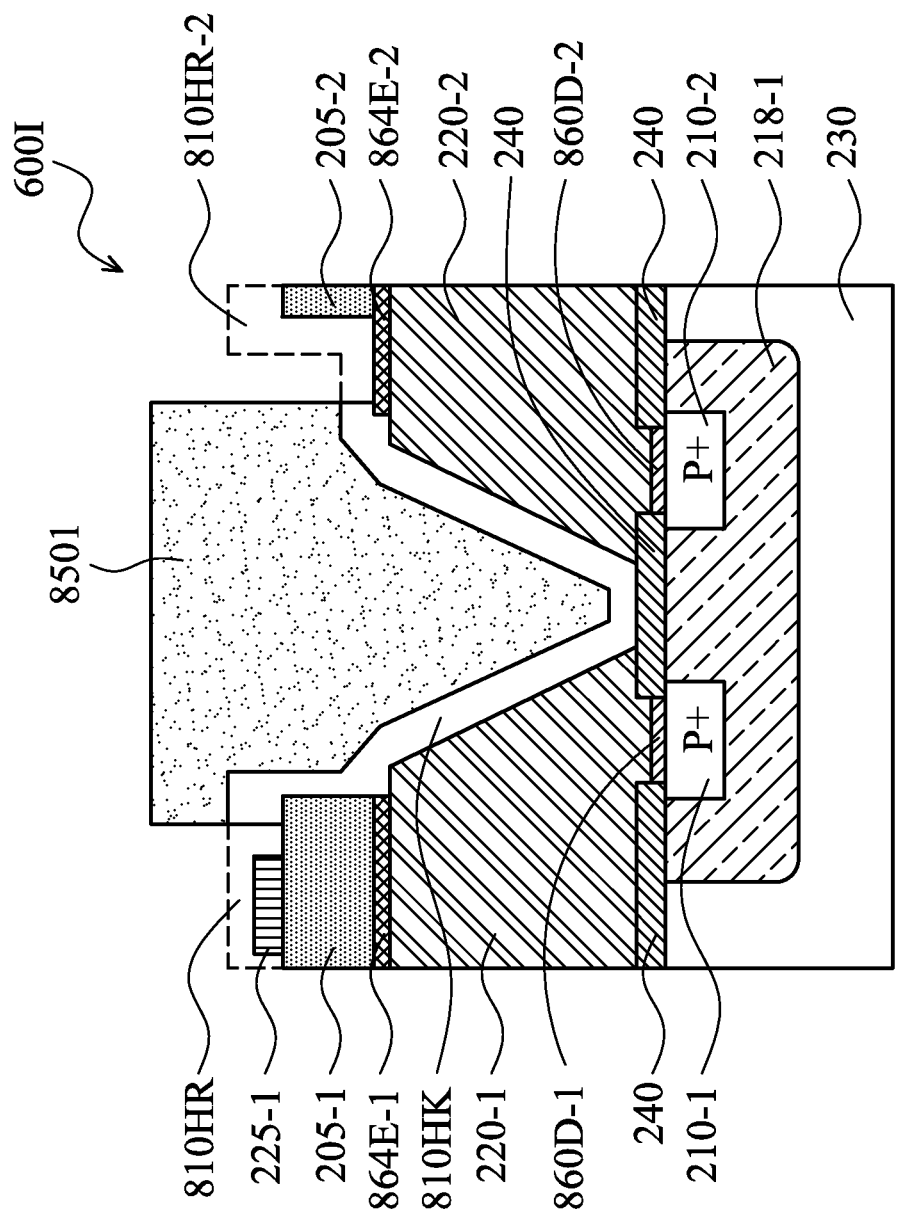

In FIG. 6I, unwanted portions of layer 810H are removed. For illustration, portion 810HK of layer 810H is kept while portions 810HR-1 and 810HR-2 are removed. In some embodiments, a photo resist layer 850I is deposited to cover portion 810HK. Portions 810HR-1 and 810R-2 are then removed, resulting in structure 600I.

Figure 6J:
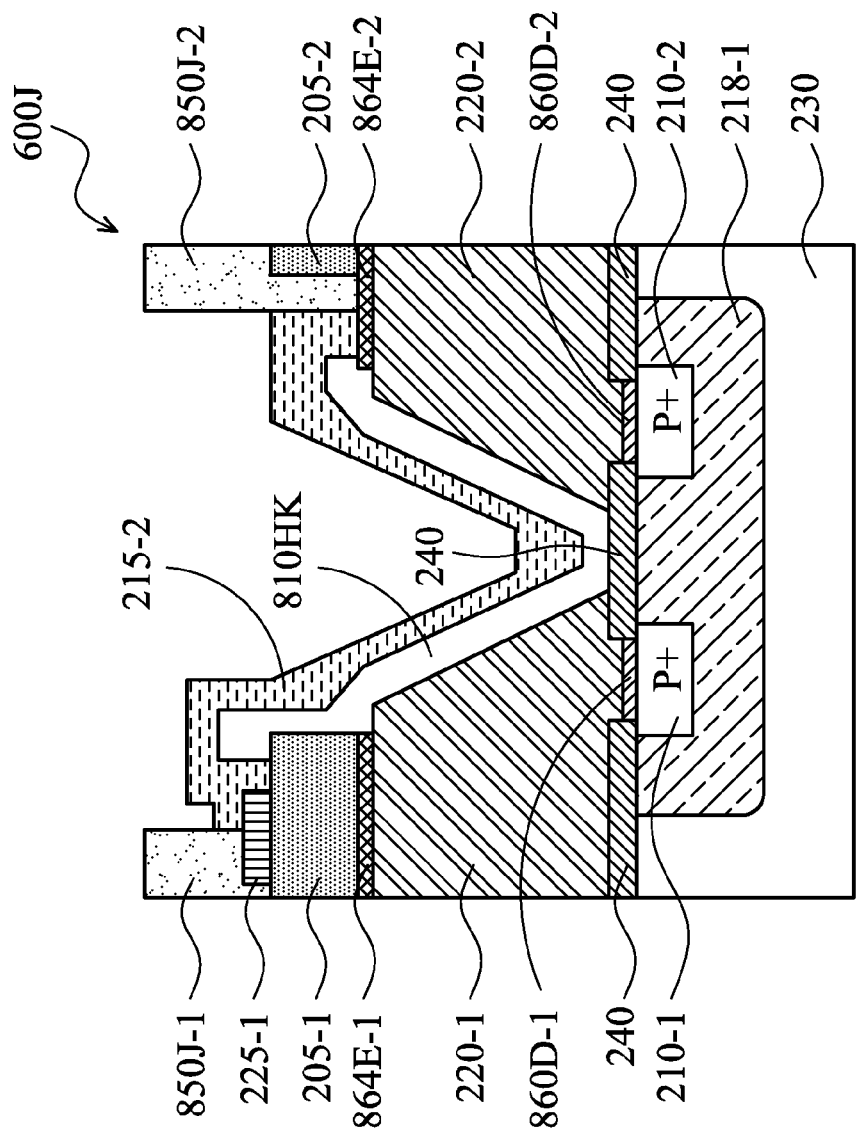

In FIG. 6J, connecting metal 215-2 is formed. In some embodiments, photo resist layers 850J-1 and 850J-2 are formed to define the boundary for layer 215-2 before layer 215-2 is deposited on top of structure 600I. For example, photo resist layer 850J-1 sets the boundary so that layer 215-2 covers a portion of connecting metal 225-1. Similarly, photo resist layer 850J-2 sets the boundary so that connecting metal 215-2 covers a portion of layer 864E-2 and is separated from LED layer 205-2.

Figure 6K:
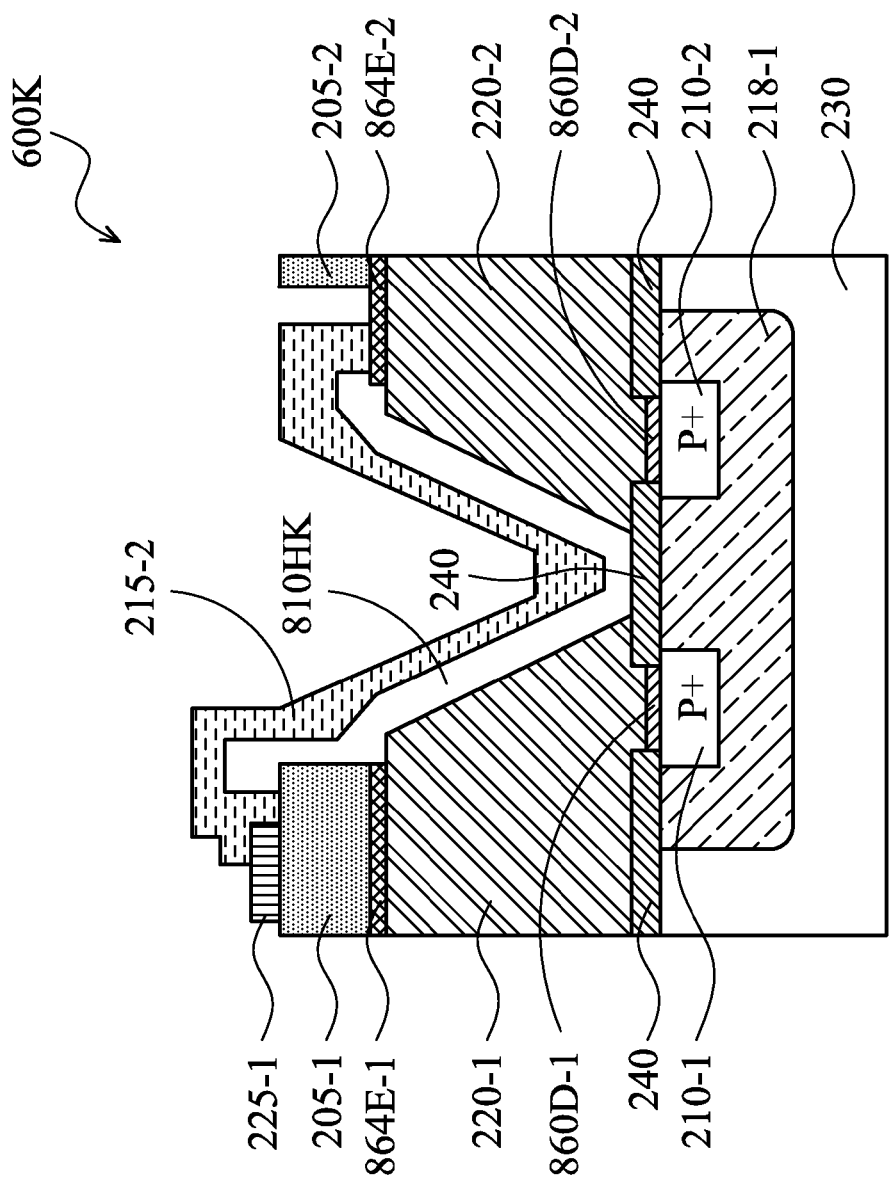

After connecting metal 215-2 is formed, photo resist layers 850J-1 and 850J-2 are removed, resulting in structure 600K shown in FIG. 6K.

In various embodiments, the chain of LEDs 105 with the corresponding Zener diodes are formed in the same die, which is advantageous over other approaches where the LEDs and the protection diodes are built individually and later integrated in a printed circuit board.

A number of embodiments have been described. It will nevertheless be understood that various modifications may be made without departing from the spirit and scope of the disclosure. For example, the steps in FIGS. 6A-6K are used for illustration. In various embodiments, a chain of LEDs 105 is formed in parallel. As a result, forming LEDs 105 in the chain is done in parallel with and/or in a similar manner as forming LED 105-1 as illustratively shown in FIGS. 6A-6K. Similarly, forming corresponding Zener diodes 110 and related connections is done in parallel with and/or in a similar manner as forming Zener diodes 105-2 and 105-3 and corresponding connections as explained with reference to FIGS. 6A-6K. Various figures show a particular dopant concentration, but different dopant concentrations are within the scope of various embodiments. For example, each of the P+ regions 210-1, 210-2, 210-3, and 210-4 may be replaced by a P or P− dopant concentration. Similarly, each of the N regions 218-1 and 218-2 may be replaced by an N− or N+ dopant concentration. Each of the N+ regions 410-1 and 410-3 may be replaced by an N or N− dopant concentration, etc.

Some embodiments regard an LED structure that comprises a first dopant region, a dielectric layer on top of the first dopant region, a bond pad layer on top of a first portion of the dielectric layer, and an LED layer having a first LED region and a second LED region. The bond pad layer is electrically connected to the first dopant region. The first LED region is electrically connected to the second bond pad layer.

Some embodiments regard an LED structure that comprises a well region, a first dopant region, a second dopant region, a dielectric layer, a first bond pad layer, a second bond pad layer, a first LED layer, and electrical coupling means. The dielectric layer is on top of the first dopant region, the second dopant region, and the well region. The first bond pad layer is separated from the second bond pad layer and is electrically connected to the first dopant region. The second bond pad layer is electrically connected to the second dopant region. The first LED layer has a first LED region and a second LED region. The first LED region is electrically connected to the first bond pad layer. The electrically coupling means couples the second LED region and the second bond pad layer.

Some embodiments regard a light emitting diode (LED) structure comprising a first well region, a second well region, a dielectric layer, a first bond pad layer, a second bond pad layer, a first LED layer, and a second LED layer. The first well region has a first dopant region and a second dopant region. The second well region has a third dopant region and a fourth dopant region. The dielectric layer is on top of the first well region and the second well region. The first bond pad layer and a second bond pad layer are on top of the dielectric layer and are electrically separated. The first LED layer has a first LED portion and a second LED portion. The second LED layer has a third LED portion and a third LED portion. The first bond pad layer is electrically connected with the first dopant region and with the first LED portion. The second LED region is electrically connected with the second bond pad layer, the second dopant region, the third dopant region, and the third LED region. The fourth LED region is electrically connected with the fourth dopant region.

Some embodiments regard a method. In the method, a well is formed in a substrate. A first implant region and a second implant region are formed in the well, resulting in a first structure. A first dielectric layer is formed over the first structure, leaving a first opening to expose at least a first portion of the first implant region and a second opening to expose at least a second portion of the second implant region, resulting in a second structure. A first bond pad layer and a second bond pad layer are formed over the second structure, resulting in a third structure. The first bond pad layer and the second bond pad layer are electrically separated. The first bond pad layer is electrically connected with the first implant region. The second bond pad layer is electrically connected with the second implant region. A first LED layer is electrically connected with the first bond pad layer, resulting in a fourth structure. The LED layer has a first LED portion and a second LED portion. The first LED portion is electrically connected with the first bond pad layer. A second dielectric layer is formed over the fourth structure, resulting in a fifth structure. A connecting layer is formed over the fifth structure. The connecting layer electrically couples the second LED portion with the second bond pad layer.

The above methods show exemplary steps, but they are not necessarily performed in the order shown. Steps may be added, replaced, changed order, and/or eliminated as appropriate, in accordance with the spirit and scope of disclosed embodiments. For example, the following are variations with respect to forming layers 864E-1 and 864E-2 in FIGS. 6D and 6E. In some embodiments, layer 850E is formed on top of structure 600D and thus on top of layer 865D. Layer 862E is formed, and layer 850E and 865D are removed. Layers 864E-1 and 864-E2 are then formed. Alternatively, after layers 850E and 862E are formed, layers 864E-1 and 864E-2 are formed. Layers 850E and 865D are then removed.

What is claimed is:
1. A method, comprising:
forming a first zener diode and a second zener diode in a substrate; forming a first bond pad over a portion of the first zener diode and a second bond pad over a portion of the second zener diode, wherein the first and second bond pads are being separated by a gap;
forming a first light-emitting diode (LED) over the first bond pad and a second LED over the second bond pad, wherein the first and second LEDs each include a light-emitting layer disposed between a first doped semiconductor layer and a second doped semiconductor layer, the first and second doped semiconductor layers having different types of conductivity;
forming a first conductive element over the first LED and a second conductive element over the second LED;
forming a patterned dielectric layer over the first and second LEDs and over sidewalls of the first and second bond pads, the patterned dielectric layer exposing the first and second conductive elements; and forming a connecting metal layer over the patterned dielectric layer, the connecting metal layer electrically interconnecting the first and second LEDs.

2. The method of claim 1, wherein the forming of the first and second zener diodes comprises:
   forming a doped well in the substrate, the doped well having a first type of conductivity; and
   forming a first doped region and a second doped region in the doped well, the first and second doped regions each having a second type of conductivity different from the first type, wherein the first and second doped regions are separated by a portion of the doped well, wherein the first and second bond pads are formed over the first and second doped regions, respectively.

3. The method of claim 2, further comprising: forming a second patterned dielectric layer over the doped well, wherein the second patterned dielectric layer includes a first opening disposed over the first doped region and a second opening disposed over the second doped region.

4. The method of claim 3, further comprising: forming contact elements over the first and second doped regions.

5. The method of claim 4, further comprising: forming a seed layer over the patterned dielectric layer and over the contact elements.

6. The method of claim 4, wherein the contact elements contain titanium silicide.

7. The method of claim 1, wherein: the forming of the connecting metal layer is performed such that the first doped semiconductor layer of the first LED is electrically coupled to the second doped semiconductor layer of the second LED.

8. The method of claim 1, wherein the forming of the first and second bond pads comprises:
   forming a conductive layer over the doped well; and
   performing a patterning process to separate the conductive layer into the first bond pad disposed over the portion of the first zener diode and the second bond pad disposed over the portion of the second zener diode.

9. A method, comprising:
   forming a doped well in a substrate, the doped well having a first type of conductivity;
   forming a first doped region and a second doped region in the doped well, the first and second doped regions each having a second type of conductivity different from the first type, wherein the first and second doped regions are separated by a portion of the doped well;
   forming a first bond pad over the first doped region and a second bond pad over the second doped region, wherein the first and second bond pads are electrically coupled to the first and second doped regions, respectively; forming a first light-emitting diode (LED) over the first bond pad and a second LED over the second bond pad;
   forming a first conductive element over the first LED and a second conductive element over the second LED;
   forming a patterned dielectric layer over the first and second LEDs and over sidewalls of the first and second bond pads, the patterned dielectric layer exposing the first and second conductive elements; and
   forming, over the patterned dielectric layer, a connecting layer that electrically interconnects the first and second LEDs.

10. The method of claim 9, wherein the first and second doped regions are heavily doped regions such that:
   the first doped region and the doped well collectively define a first zener diode; and
   the second doped region and the doped well collectively define a second zener diode.

11. The method of claim 9, further comprising: forming a second patterned dielectric layer over the doped well, wherein the second patterned dielectric layer includes a first opening disposed over the first doped region and a second opening disposed over the second doped region;
   forming contact elements over the first and second doped regions; and
   forming a seed layer over the second patterned dielectric layer and over the contact elements.

12. The method of claim 9, wherein the forming of the first and second bond pads comprises:
   forming a conductive layer over the doped well; and
   performing a patterning process to separate the conductive layer into the first bond pad disposed over the first doped region and the second bond pad over the second doped region.

13. The method of claim 9, wherein:
   the first and second LEDs each include a light-emitting layer disposed between a first doped semiconductor layer and a second doped semiconductor layer, the first and second doped semiconductor layers having different types of conductivity; and
   the forming of the connecting layer is performed such that the first doped semiconductor layer of the first LED is electrically coupled to the second doped semiconductor layer of the second LED.

14. A method, comprising:
   forming a doped well in a substrate, the doped well having a first type of conductivity;
   forming a first zener diode and a second zener diode in the substrate by forming a first heavily doped region and a second heavily doped region in the doped well, the first and second heavily doped regions each having a second type of conductivity different from the first type, wherein the first and second heavily doped regions are separated by a portion of the doped well;
   forming a patterned dielectric layer over the doped well, wherein the patterned dielectric layer includes a first opening disposed over the first doped region and a second opening disposed over the second doped region;
   forming silicide elements over the first and second heavily doped regions;
   forming a seed layer over the patterned dielectric layer and over the silicide elements;
   forming a conductive layer over the seed layer;
   performing a patterning process to separate the conductive layer into a first bond pad disposed over the first heavily doped region and a second bond pad over the second heavily doped region;
   forming a first light-emitting diode (LED) over the first bond pad and a second LED over the second bond pad, the first and second LEDs each including a light-emitting layer disposed between a first doped semiconductor layer and a second doped semiconductor layer, the first and second doped semiconductor layers having different types of conductivity;
   forming a first conductive element over the first LED and a second conductive element over the second LED; and
   forming a further patterned dielectric layer over the first and second LEDs and over sidewalls of the first and second bond pads, the further patterned dielectric layer exposing the first and second conductive elements.

15. The method of claim 14, further comprising: forming a connecting metal layer over the further patterned dielectric layer, wherein the connecting metal layer electrically interconnects the first and second LEDs.

16. The method of claim 15, wherein: the forming of the connecting metal layer is performed such that the first doped semiconductor layer of the first LED is electrically coupled to the second doped semiconductor layer of the second LED.

* * * * *